(12) United States Patent
Pan et al.

(10) Patent No.: US 12,317,417 B2
(45) Date of Patent: May 27, 2025

(54) CONNECTION STRUCTURE AND ELECTRONIC DEVICE

(71) Applicant: InnoLux Corporation, Miao-Li County (TW)

(72) Inventors: Mei-Hsiu Pan, Miao-Li County (TW); Mei-Chi Hsu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 362 days.

(21) Appl. No.: 18/063,714

(22) Filed: Dec. 9, 2022

(65) Prior Publication Data

US 2023/0225052 A1 Jul. 13, 2023

(30) Foreign Application Priority Data

Jan. 7, 2022 (CN) .......................... 202210017348.6

(51) Int. Cl.
*H05K 1/11* (2006.01)
*H01L 23/522* (2006.01)

(52) U.S. Cl.
CPC .......... *H05K 1/115* (2013.01); *H01L 23/5226* (2013.01)

(58) Field of Classification Search
CPC .................................................... H05K 1/115
See application file for complete search history.

(56) References Cited

U.S. PATENT DOCUMENTS

| 2019/0252634 A1* | 8/2019 | Kim | ..................... H10K 50/814 |
| 2020/0343271 A1* | 10/2020 | Kao | ..................... H01L 25/0753 |
| 2021/0305346 A1* | 9/2021 | Kwak | ..................... H01L 24/32 |

FOREIGN PATENT DOCUMENTS

TW 200708864 A 3/2007

* cited by examiner

*Primary Examiner* — Sherman Ng
(74) *Attorney, Agent, or Firm* — McClure, Qualey & Rodack, LLP

(57) ABSTRACT

A connection structure is provided. The connection structure includes a first conductive pad, a first insulating layer, a second conductive pad, a second insulating layer, and a third conductive pad. The first insulating layer is disposed on the first conductive pad and includes a first through-hole. The second conductive pad is disposed on the first insulating layer and electrically connected to the first conductive pad through the first through-hole. The second insulating layer is disposed on the second conductive pad and includes a second through-hole and a first recessed portion. The first recessed portion overlaps the first through-hole. The third conductive pad is disposed on the second insulating layer and electrically connected to the second conductive pad through the second through-hole. The third conductive pad extends on a surface of the first recessed portion.

16 Claims, 12 Drawing Sheets

CONNECTION STRUCTURE AND ELECTRONIC DEVICE

CROSS REFERENCE TO RELATED APPLICATIONS

This application claims the benefit of China Application No. 202210017348.6, filed Jan. 7, 2022, the entirety of which is incorporated by reference herein.

BACKGROUND

Technical Field

The present disclosure is related to a connection structure and an electronic device, and in particular it is related to a connection structure that can improve the peeling problem of the conductive pad and an electronic device including the connection structure.

Description of the Related Art

With the flourishing development of various electronic products, consumers have high expectations for the quality, function, or price of these products.

The circuit substrate and the electronic elements in an electronic device are usually electrically connected by connection structures (conductive pads) or other conductive elements. The connection structures are usually formed by stacking multiple layers of materials. However, the bondability of different material layers may affect the performance of the connection structure (e.g. it may affect electrical conductivity), thereby affecting the yield of the electronic device. Therefore, researchers in this industry are currently seeking to develop a structural design that can improve the performance of the connection structures.

SUMMARY

In accordance with some embodiments of the present disclosure, a connection structure is provided. The connection structure includes a first conductive pad, a first insulating layer, a second conductive pad, a second insulating layer, and a third conductive pad. The first insulating layer is disposed on the first conductive pad and includes a first through-hole. The second conductive pad is disposed on the first insulating layer and electrically connected to the first conductive pad through the first through-hole. The second insulating layer is disposed on the second conductive pad and includes a second through-hole and a first recessed portion. The first recessed portion overlaps the first through-hole. The third conductive pad is disposed on the second insulating layer and electrically connected to the second conductive pad through the second through-hole. In addition, the third conductive pad extends on a surface of the first recessed portion.

In accordance with some embodiments of the present disclosure, an electronic device is provided. The electronic device includes a substrate, an electronic unit, a driving unit, and a connection structure. The electronic unit is disposed on the substrate. The driving unit is disposed on the substrate. The connection structure is disposed on the substrate and electrically connected to the electronic unit and the driving unit. The connection structure includes a first conductive pad, a first insulating layer, a second conductive pad, a second insulating layer, and a third conductive pad. The first insulating layer is disposed on the first conductive pad and includes a first through-hole. The second conductive pad is disposed on the first insulating layer and electrically connected to the first conductive pad through the first through-hole. The second insulating layer is disposed on the second conductive pad and includes a second through-hole and a first recessed portion. The first recessed portion overlaps the first through-hole. The third conductive pad is disposed on the second insulating layer and electrically connected to the second conductive pad through the second through-hole. In addition, the third conductive pad extends on a surface of the first recessed portion.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
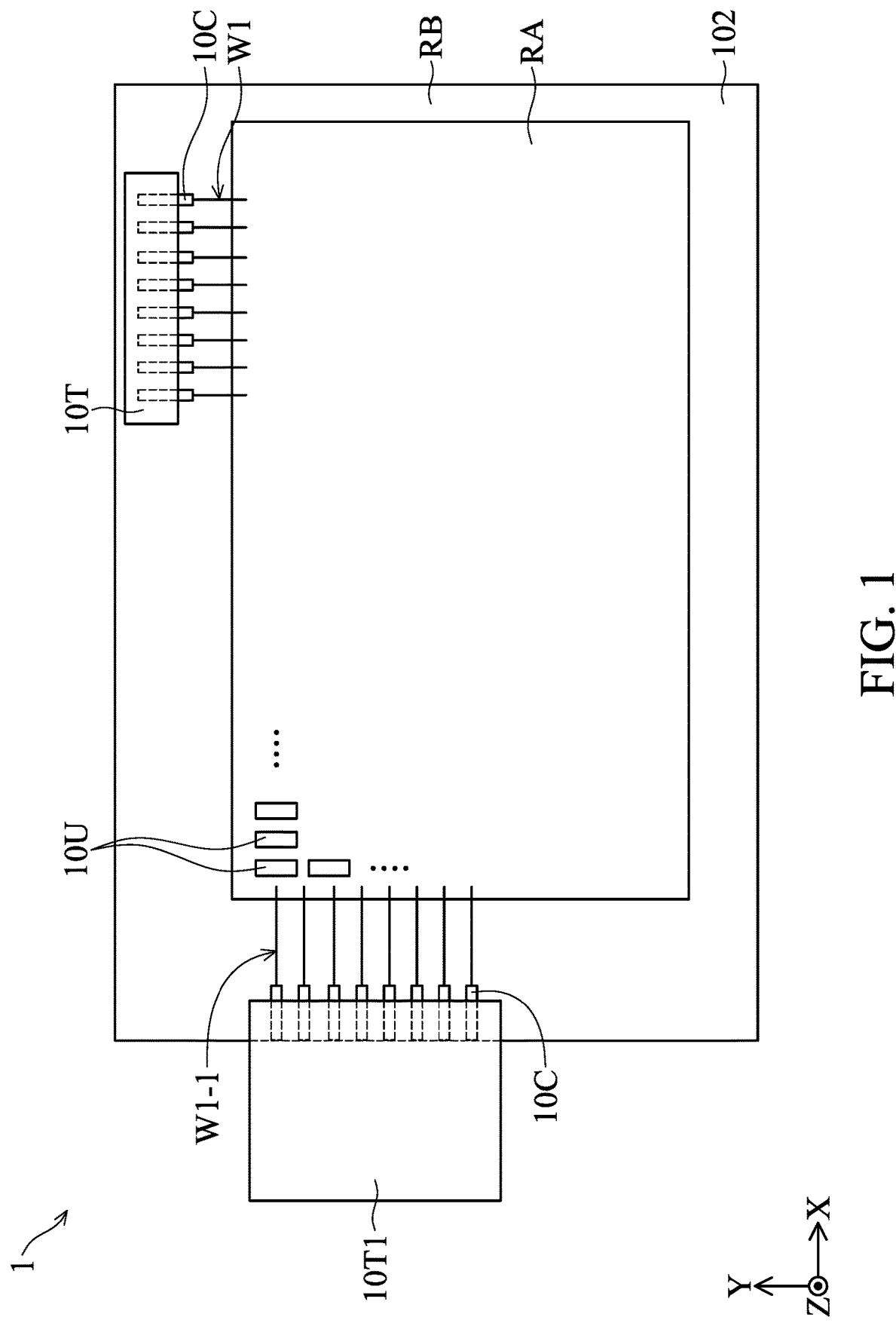
FIG. 1 is a top-view diagram of an electronic device in accordance with some embodiments of the present disclosure.

A connection structure and an electronic device according to the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as a part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on or over a second material layer" may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on or over the second material layer" means that the first material layer is in direct contact with the second material layer, and there is no intermediate element or layer between the first material layer and the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "electrically coupled to" may include any direct or indirect electrical connection means.

In the following descriptions, terms "about" and "substantially" typically mean+/−10% of the stated value, or typically +/−5% of the stated value, or typically +/−3% of the stated value, or typically +/−2% of the stated value, or typically +/−1% of the stated value or typically +/−0.5% of the stated value. The stated value of the present disclosure is an approximate value. That is, when there is no specific description, the stated value includes the meaning of "about" and "substantially". Moreover, the expression "in a range from the first value to the second value" or "between the first value and the second value" means that the range includes the first value, the second value, and other values in between. In addition, certain errors may exist between any two values or directions used for comparison. If the first value is equal to the second value, it implies that there may be a 10% error between the first value and the second value; if the first direction is perpendicular to the second direction, the angle between the first direction and the second direction may be between 80 degrees and 100 degrees; if the first direction is parallel to the second direction, the angle between the first direction and the second direction may be between 0 degrees and 10 degrees.

Throughout the present disclosure and the appended claims, certain terms are used to refer to specific elements. Those skilled in the art should understand that electronic device manufacturers may refer to the same element with different names. The present disclosure does not intend to distinguish between elements that have the same function but different names. In the specification and claims, the terms "comprising", "including", "having" and the like are open-ended phrases, so they should be interpreted as "including but is not limited to . . . ". Therefore, when the terms "comprising", "including" and/or "having" are used in the description of the present disclosure, they specify the corresponding features, regions, steps, operations and/or components, but do not exclude the existence of one or more corresponding features, regions, steps, operations and/or components.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with the embodiments of the present disclosure, a connection structure is provided, which includes a conductive pad extending in a recessed structure, thereby increasing the contact area between the conductive pad and the underlying structure. The adhesion between the conductive pad and the underlying structure can be improved. The risk of peeling off between layers can be reduced.

The electronic device of the present disclosure may include a display device, a backlight device, a touch device, a sensing device, an antenna device, or a tiled device (a tiled device having any of the above functions or combined functions), but it is not limited thereto. The electronic device may include a bendable or flexible electronic device, but it is not limited thereto. The antenna device may be a liquid-crystal antenna device or a non-liquid-crystal antenna device. The sensing device may be a sensing device for sensing capacitance, light, heat or ultrasonic waves, but it is not limited thereto. The electronic device may include, for example, liquid crystal, quantum dot (QD), fluorescence, phosphor, another suitable material, or a combination thereof. In accordance with some embodiments, the electronic device may include an electronic unit, and the electronic unit may include passive elements and active elements, for example, capacitors, resistors, inductors, diodes, transistors, or a combination thereof, but they are not limited thereto. The diodes may include, for example, organic light-emitting diodes (OLEDs), micro light-emitting diodes (micro-LEDs, mini-LEDs) or quantum dot light-emitting diodes (QLEDs, QDLEDs), but they are not limited thereto. In accordance with some embodiments, the electronic device may include a panel and/or a backlight module, and the panel may include, for example, a liquid-crystal panel or another self-luminous panel, but it is not limited to. It should be understood that the electronic device of the present disclosure will be described below by taking a display device as an example, but the present disclosure is not limited thereto.

Refer to FIG. 1, which is a top-view diagram of an electronic device 1 in accordance with some embodiments of the present disclosure. For clarity, some elements of the electronic device 1 are omitted in the figures, and only some elements are schematically shown. In accordance with some embodiments, additional features may be added to the electronic device 1 described below. In accordance with some other embodiments, some features of the electronic device 1 described below may be replaced or omitted.

The electronic device 1 may include a substrate 102. The substrate 102 may have an operation area RA and a peripheral area RB, and the peripheral area RB is adjacent to at least one side of the operation area RA. For example, the peripheral area RB may be disposed surrounding the operation area RA. In accordance with some embodiments, the operation area RA may be different according to the application of the electronic device 1. For example, the operation area RA may include a display area, a detection area, a touch area, another suitable application area, or a combination thereof, and the peripheral area RB may be the area other than the operation area RA. The electronic device 1 may include an electronic unit 10U, a driving unit (e.g., a driving unit 10T and/or a driving unit 10T1) and a connection structure 10C. The electronic unit 10U, the driving unit (e.g., the driving unit 10T and/or the driving unit 10T1) and the connection structure 10C may be disposed on the substrate 102. Specifically, the electronic unit 10U may be disposed in the operation area RA, and the driving unit (e.g., the driving unit 10T and/or the driving unit 10T1) may be disposed in the peripheral area RB. The electronic unit 10U and the driving unit 10T may be electrically connected through the connection structure 10C, and the driving unit 10T may be used to control the electronic unit 10U. The electronic unit 10U and the driving unit 10T1 may be electrically connected through the connection structure 10C and a wiring W1-1, and the driving unit 10T-1 may be used to control the electronic unit 10U. Specifically, the driving unit 10T and/or the driving unit 10T1 may have bonding pads (not illustrated), and the bonding pads of the driving unit 10T and/or the driving unit 10T1 may be respectively electrically connected to the connection structure 10C. In accordance with some embodiments, the connection structure 10C and the bonding pads (not illustrated) of the driving unit 10T (and/or the driving unit 10T1) may at least partially overlap in a normal direction Z of the substrate 102. In accordance with some embodiments, the connection structure 10C may be electrically connected to a wiring W1 (or the wiring W1-1), and the wiring W1 (or the wiring W1-1) may extend from the peripheral area RB to the operation area RA to be electrically connected to the electronic unit 10U, but it is not limited thereto. In accordance with some embodiments, the wiring W1 (or the wiring W1-1) may be a single-layer or composite-layer structure. In accordance with some embodiments, the wiring W1 (or the wiring W1-1) may be, for example, the same layer as one of the conductive pads in the connection structure 10C, but it is not limited thereto, which will be described in detail later.

In accordance with some embodiments, the electronic unit 10U may be a pixel, and the pixel may include at least one thin-film transistor (TFT). The thin-film transistor may be used as a switching transistor, a driving transistor, and a reset transistor, or another suitable thin-film transistor, but it is not limited thereto. In accordance with some embodiments, the driving unit 10T may include an integrated circuit (IC), a microchip, a flexible printed circuit (FPC) or another suitable driving element, but it is not limited thereto. In accordance with some embodiments, the driving unit 10T may be disposed on the substrate 102 in the form of chip on film (COF), chip on glass (COG), etc., but it is not limited thereto. In accordance with some embodiments, the electronic device 1 may include a plurality of driving units 10T, and the driving units 10T may be located in the peripheral area RB and adjacent to the same side or different sides of the operation area RA. For example, in accordance with some embodiments of the present disclosure, as shown in FIG. 1, the operation area RA may have four sides and two driving units (e.g., driving unit 10T and driving unit 10T1), and the two driving units (e.g., driving unit 10T and driving unit 10T1) may be located in the peripheral area RB and adjacent to two sides of the operation area RA, but it is not limited thereto. In accordance with some embodiments, the driving unit 10T and the driving unit 10T1 may be used for transmitting different signals (e.g., scanning signals or data signals), but it is not limited thereto. In other words, the wiring W1 and the wiring W1-1 may be used for transmitting different signals (e.g., scanning signals or data signals), but it is not limited thereto. It should be understood that the number or arrangement of the electronic units 10U and the driving units are not limited to those shown in the figures. In accordance with some embodiments, a circuit structure (not illustrated) is disposed on the substrate 102 to serve as a driving substrate in the panel. In addition to the aforementioned electronic unit 10U, driving unit (e.g., driving unit 10T and/or driving unit 10T1) and/or connection structure 10C, the substrate 102 may be further provided with data lines (not illustrated) and scan lines (not illustrated), power lines (not illustrated), conductive pads, other circuits or components, etc., but it is not limited thereto. The substrate 102 may include a rigid substrate or a flexible substrate. In accordance with some embodiments, the material of the substrate 102 may include glass, quartz, ceramic, sapphire, polyimide (PI), polycarbonate (PC), polyethylene terephthalate (PET), another suitable material or a combination thereof, but it is not limited thereto.

Figure 2:
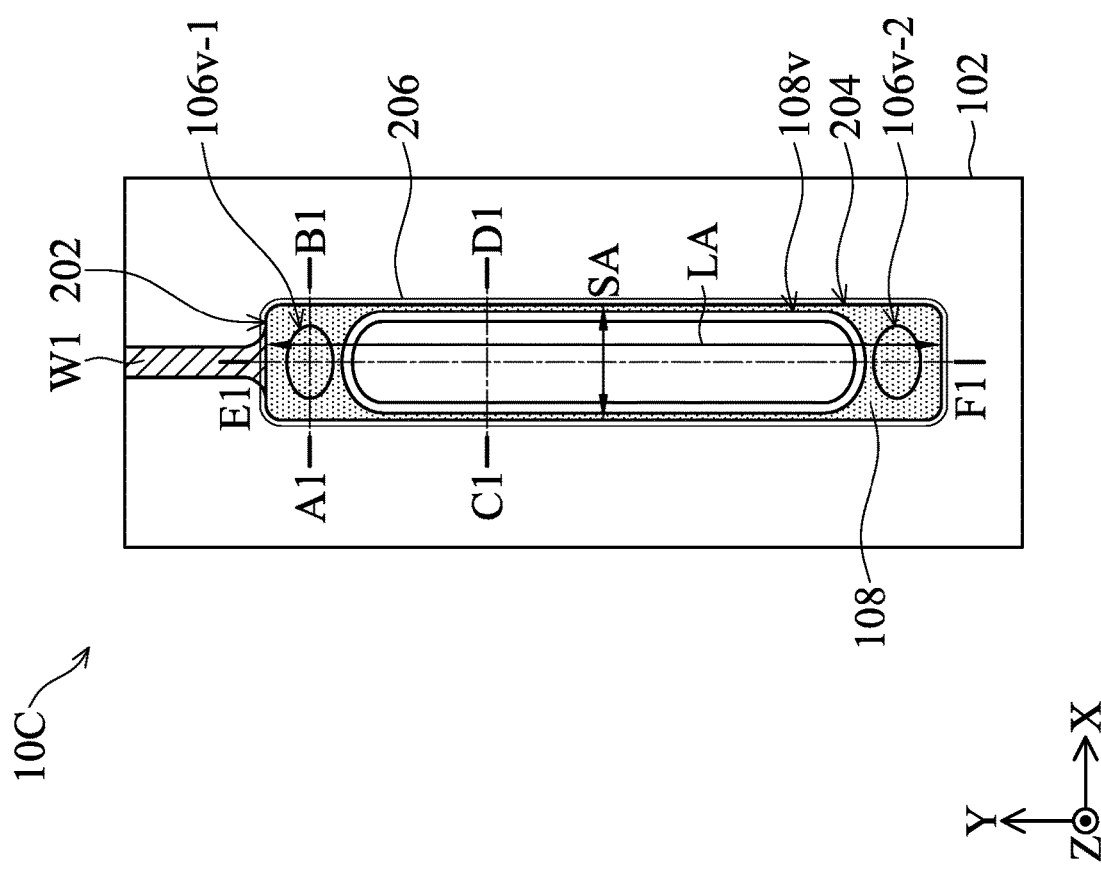
FIG. 2 is a top-view diagram of a connection structure in accordance with some embodiments of the present disclosure.
Figure 3:
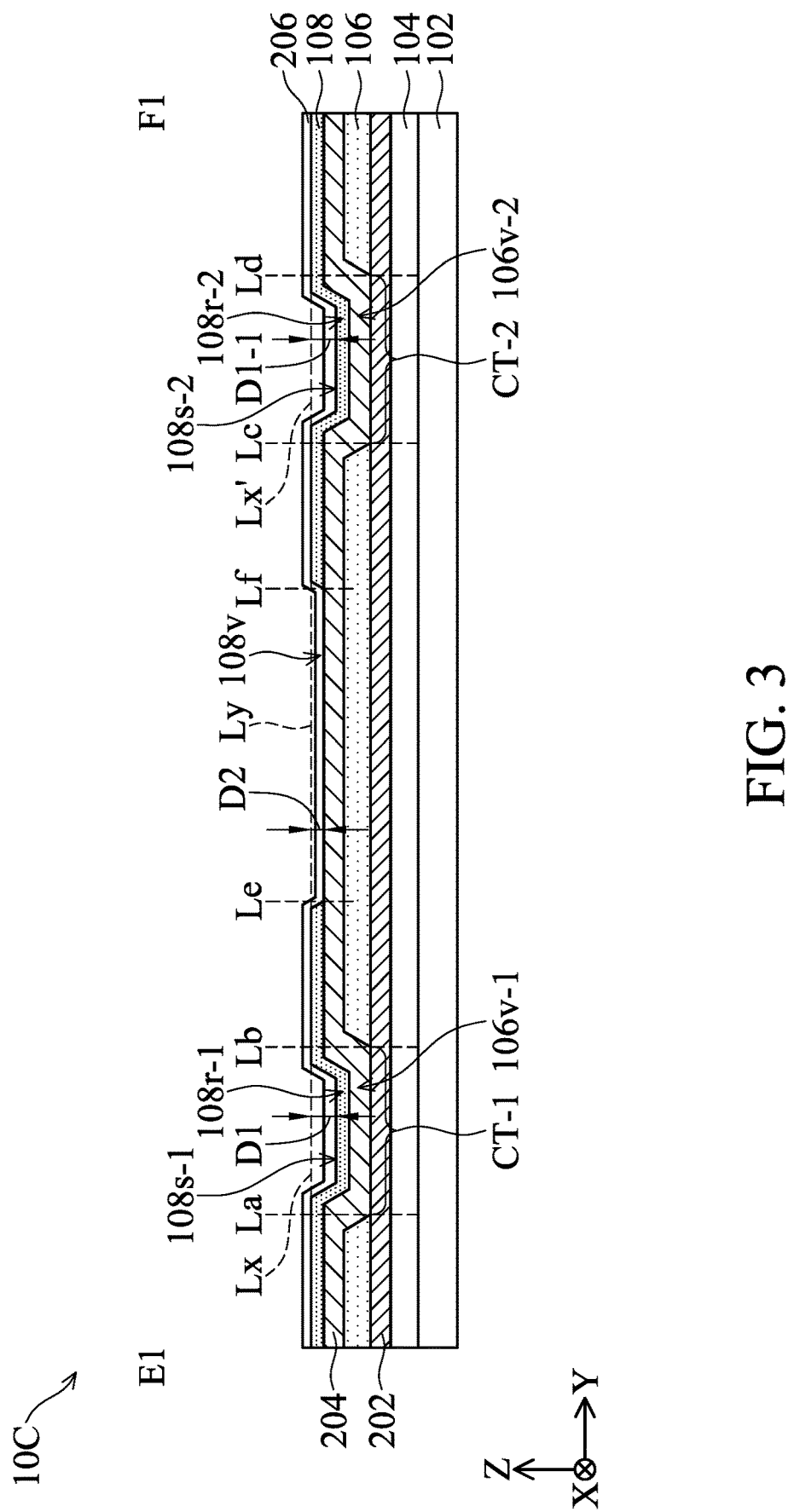
FIG. 3 is a cross-sectional diagram of a connection structure corresponding to the section line E1-F1 of FIG. 2 in accordance with some embodiments of the present disclosure.

Refer to FIG. 2 and FIG. 3. FIG. 2 is a top-view diagram of the connection structure 10C in accordance with some embodiments of the present disclosure. FIG. 3 is a cross-sectional diagram of the connection structure 10C corresponding to the section line E1-F1 of FIG. 2 in accordance with some embodiments of the present disclosure. In accordance with some embodiments, additional features may be added to the connection structure 10C described below.

Refer to FIG. 2 and FIG. 3, the connection structure 10C may include an insulating layer 104, a first conductive pad 202, a first insulating layer 106, a second conductive pad 204, a second insulating layer 108 and/or a third conductive pad 206, but it is not limited thereto. Specifically, the insulating layer 104 may be disposed on the substrate 102, the first conductive pad 202 may be disposed on the insulating layer 104, the first insulating layer 106 may be disposed on the first conductive pad 202, the second conductive pad 204 may be disposed on the first insulating layer 106, the second insulating layer 108 may be disposed on the second conductive pad 204, and the third conductive pad 206 may be disposed on the second insulating layer 108. In addition, another layer may be optionally formed between the above-mentioned layers.

In accordance with some embodiments, the insulating layer 104, the first insulating layer 106 and/or the second insulating layer 108 may have a single-layer or multi-layer structure, and the materials of the multi-layers may be the same or different. In accordance with some embodiments, the materials of the insulating layer 104, the first insulating layer 106 and/or the second insulating layer 108 may include inorganic materials or organic materials, but they are not limited thereto. For example, the materials of the insulating layer 104, the first insulating layer 106 and/or the second insulating layer 108 may include silicon nitride, silicon oxide, silicon oxynitride, another suitable material or a combination thereof, but they are not limited thereto.

In accordance with some embodiments, the connection structure 10C may be located in the peripheral area RB, and the connection structure 10C may be electrically connected to the wiring W1 (or the wiring W1-1). For example, the first conductive pad 202 of the connection structure 10C may be electrically connected to the wiring W1 (or the wiring W1-1), but it is not limited thereto. In accordance with some other embodiments (not illustrated), the connection structure 10C and the wiring W1 may be electrically connected optionally by a via hole (not illustrated). In accordance with some embodiments, the first conductive pad 202 in the connection structure 10C may have a long axis LA extending along a first direction Y and a short axis SA extending along a second direction X. In accordance with some embodiments, the first direction Y may be substantially perpendicular to and the second direction X. In accordance with some embodiments, the profile of the first conductive pad 202 may have an arc-shaped edge. It should be understood that the shape of the first conductive pad 202 is not limited to that shown in the figures, and the first conductive pad 202 may have another suitable shape.

In accordance with some embodiments, the first conductive pad 202 may include a conductive material, such as a metal material, but it is not limited thereto. The first conductive pad 202 may have a single-layer or multi-layer structure, and the materials of the multi-layer structure may be the same or different. The metal material may include copper (Cu), aluminum (Al), molybdenum (Mo), indium (In), tin (Sn), gold (Au), zinc (Zn), silver (Ag), titanium (Ti), lead (Pb), nickel (Ni), another suitable conductive material, or a combination thereof, but it is not limited thereto.

In accordance with some embodiments, the first insulating layer 106 may be disposed on the first conductive pad 202 and include a first through-hole 106v-1, and the first through-hole 106v-1 may expose a portion of the first conductive pad 202. The first insulating layer 106 may include a third through-hole 106v-2, and the third through-hole 106v-2 may expose a portion of the first conductive pad 202. In accordance with some embodiments, the first through-holes 106v-1 and the third through-holes 106v-2 may substantially be arranged along the first direction Y in which the long axis LA of the first conductive pad 202 extends. In accordance with some embodiments, the number of through-holes (including the first through-hole 106v-1 and the third through-hole 106v-2) of the first insulating layer 106 may be more or less.

It should be understood that the shapes of the first through-holes 106v-1 and the third through-holes 106v-2 are not limited to those shown in the figures (e.g., oval shapes). In accordance with different embodiments, the first through-holes 106v-1 and the third through-hole 106v-2 may have another suitable shape (e.g., a circular shape or a shape with a curved edge). Furthermore, the shape (and/or size) of the first through-hole 106v-1 may be the same as or different from the shape (and/or size) of the third through-hole 106v-2.

In accordance with some embodiments, the second conductive pad 204 may be disposed on the first insulating layer 106 and electrically connected to the first conductive pad 202 through the first through-hole 106v-1. Specifically, the second conductive pad 204 may be disposed on the first insulating layer 106 and filled in the first through-hole 106v-1, so that the second conductive pad 204 is in contact with and electrically connected to the first conductive pad 202 that is exposed by the first through-hole 106v-1, but it is not limited thereto. In accordance with some embodiments, the second conductive pad 204 may be electrically connected to the first conductive pad 202 through the third through-hole 106v-2. Specifically, the second conductive pad 204 may be filled in the third through-hole 106v-2, so that the second conductive pad 204 is in contact with and electrically connected to the first conductive pad 202 that is exposed by the third through-hole 106v-2.

As shown in FIG. 3, in accordance with some embodiments, the first conductive pad 202 may include two contact portions (e.g., contact portion CT-1 and contact portion CT-2), and the second conductive pad 204 may be in contact with and electrically connected to one of the two contact portions through the first through-hole 106v-1, and the second conductive pad 204 may be in contact with and electrically connected to the other of the two contact portions through the third through-hole 106v-2. In detail, the second conductive pad 204 may be in contact with and electrically connected to the contact portion CT-1 through the first through-hole 106v-1, and the second conductive pad 204 may be in contact with and electrically connected to the contact portion CT-2 through the third through-hole 106v-2. As mentioned above, the first conductive pad 202 has the long axis LA extending along the first direction Y, and the two contact portions (e.g., the contact portion CT-1 and the contact portion CT-2) may substantially be arranged along the first direction Y, but it is not limited thereto. In other words, the first through-holes 106v-1 and the third through-holes 106v-2 may substantially be arranged along the first direction Y.

In accordance with some embodiments, the second conductive pad 204 may include a conductive material, such as a metal material, but it is not limited thereto. The second conductive pad 204 may have a single-layer or multi-layer structure, and the materials of the multi-layers may be the same or different. The materials of the first conductive pad 202 and the second conductive pad 204 may be the same or different. The number of layers of the first conductive pad 202 and the second conductive pad 204 may be the same or different.

As shown in FIG. 3, in accordance with some embodiments, the second insulating layer 108 may be disposed on the second conductive pad 204 and include a second through-hole 108v and a first recessed portion 108r-1, and the first recessed portion 108r-1 may overlap the first through-hole 106v in the normal direction Z of the substrate 102. In accordance with some embodiments, the second through-hole 108v of the second insulating layer 108 may expose a portion of the second conductive pad 204. In accordance with some embodiments, the second insulating layer 108 may include a second recessed portion 108r-2, and the second recessed portion 108r-2 may overlap the third through-hole 106v-2 in the normal direction Z of the substrate 102. In accordance with some embodiments, in the normal direction Z of the substrate 102, the two contact portions (e.g., the contact portion CT-1 and the contact portion CT-2) do not overlap the second through-hole 108v.

In accordance with some embodiments, in the cross section of the connection structure 10C, the upper surface of the first recessed portion 108r-1 or the upper surface of the second recessed portion 108r-2 may have an arc-shaped edge, but it is not limited thereto. In accordance with some embodiments, in the normal direction Z of the substrate 102, the profile or size of the second through-hole 108v may be different from that of the first through-hole 106v-1 or the third through-hole 106v-2. In accordance with some embodiments, the number of through-holes of the first insulating layer 106 is the same as or different from the number of through-holes of the second insulating layer 108.

In accordance with the embodiments of the present disclosure, in the cross section of the connection structure 10C, two ends of the upper surface of the first conductive pad 202 exposed by the first through-hole 106v-1 define a virtual line La and a virtual line Lb respectively, and the portion of the second insulating layer 108 located in the range of the virtual line La and the virtual line Lb may be defined as the first recessed portion 108r-1. Furthermore, the virtual line La and the virtual line Lb may extend substantially along the normal direction Z of the substrate 102. Similarly, in the cross section of the connection structure 10C, two ends of the upper surface of the first conductive pad 202 exposed by the third through-hole 106v-2 define a virtual line Lc and a virtual line Ld respectively, and the portion of the second insulating layer 108 located in the range of the virtual line Lc and the virtual line Ld may be defined as the second recessed portion 108r-2. Furthermore, the aforementioned virtual line Lc and virtual line Ld may extend substantially along the normal direction Z of the substrate 102.

As mentioned above, FIG. 3 corresponds to the cross-sectional diagram of the connection structure 10C along the section line E1-F1 of FIG. 2, and the section line E1-F1 may be the section line extending along the first direction Y (i.e. the extending direction of the long axis LA of the first conductive pad 202). As shown in FIG. 3, the first recessed portion 108r-1 may have a depth D1, and the second through-hole 108v may have a depth D2. The depth D1 of the first recessed portion 108r-1 may be different from the depth D2 of the second through-hole 108v, but it is not limited thereto. In accordance with some embodiments, the depth D1 of the first recessed portion 108r-1 may be greater than the depth D2 of the second through-hole 108v.

Referring to FIG. 3, the definition of the depth D1 of the first recessed portion 108r-1 is as follows. First, the virtual line La and the virtual line Lb may intersect with the surface of the second insulating layer 108 (i.e. the surface 108s-1 of the first recessed portion 108r) at two points (not labeled), and a virtual line Lx may be obtained by connecting the two points. Next, the depth D1 of the first recessed portion 108r-1 may be defined as the maximum distance between the virtual line Lx and the surface 108s-1 of the first recessed portion 108r-1 in the normal direction Z of the substrate 102.

In addition, the definition of the depth D2 of the second through-hole 108v is as follows. First, find the two ends (not labeled) of the upper surface of the second conductive pad 204 exposed by the second through-hole 108v. Next, find virtual lines that pass through the two ends and extend substantially along the normal direction Z of the substrate 102 respectively, such as a virtual line Le and a virtual line Lf. Next, in the direction of section line of the cross-sectional diagram (e.g., the first direction Y), two points (not labeled) intersecting with the second insulating layer 108 may be obtained respectively from the virtual line Le and the virtual line Lf about 1 micrometer (μm) the direction away from the second through-hole 108v, and a virtual line Ly may be obtained by connecting the two points. Next, the depth D2 of the second through-hole 108v may be defined as the maximum distance between the virtual line Ly and the upper surface of the second conductive pad 204 that is exposed by the second through-hole 108v in the normal direction Z of the substrate 102.

Similarly, the second recessed portion 108r-2 may have a depth D1-1, and the depth D1-1 of the second recessed portion 108r-2 may be different from the depth D2 of the second through-hole 108v, but it is not limited thereto. Furthermore, the depth D1 of the first recessed portion 108r-1 may be the same as or different from the depth D1-1 of the second recessed portion 108r-2. The depth D1-1 of the second recessed portion 108r-2 may be defined as follows. First, the virtual line Lc and the virtual line Ld may intersect with the surface of the second insulating layer 108 (i.e. the surface 108s-2 of the second recessed portion 108r-2) at two points (not labeled), and a virtual line Lx' may be obtained by connecting the two points. Next, the depth D1-1 of the second recessed portion 108r-2 may be defined as the maximum distance between the virtual line Lx' and the surface 108s-2 of the second recessed portion 108r-2 in the normal direction Z of the substrate 102.

In accordance with some embodiments, the depth D1 of the first recessed portion 108r-1 may be between 250 nanometers (nm) and 900 nm (i.e. 250 nm≤depth D1≤900 nm), or between 350 nm and 850 nm, for example, 500 nm, 600 nm, 700 nm or 800 nm, but it is not limited thereto. In accordance with some embodiments, the depth D2 of the second through-hole 108v may be between 50 nm and 800 nm (i.e. 50 nm≤depth D2≤800 nm), or between 60 nm and 750 nm, for example, 100 nm, 200 nm, 300 nm, 400 nm, 500 nm, 600 nm or 700 nm, but it is not limited thereto. In accordance with some embodiments, the depth D1-1 of the second recessed portion 108r-2 may be between 250 nanometers (nm) and 900 nm (i.e. 250 nm≤depth D1-1≤900 nm), or between 350 nm and 850 nm, for example, 500 nm, 600 nm, 700 nm or 800 nm, but it is not limited thereto.

It should be noted that, as shown in FIG. 3, the depth D1 of the first recessed portion 108r-1, the depth D2 of the second recessed portion 108r-2, and the depth D1-1 of the second recessed portion 108r-2 may be measured in the same cross-sectional diagram, but it is not limited thereto. FIG. 3 of the present disclosure is a cross-sectional diagram of the connection structure 10C along the section line E1-F1 (extending substantially along the first direction X) in FIG. 2, but it is not limited thereto. The depth D1, the depth D2 and the depth D1-1 may be measured in the same cross-sectional diagram, but the extending direction of the section line of the cross-sectional diagram may be another suitable direction other than the first direction X.

It should be noted that although the depth D1, the depth D2, and the depth D1-1 shown in FIG. 3 are compared by the measurement results in the same cross-sectional diagram, but it is not limited thereto. In other cases, the depth D1, the depth D2 and the depth D1-1 may also be measured in different cross-sectional diagrams, but the directions of the section lines of different cross-sectional diagrams should extend along the same direction (for example, the first direction Y, the second direction X or another suitable direction), as shown in FIG. 4 and FIG. 5.

Figure 4:
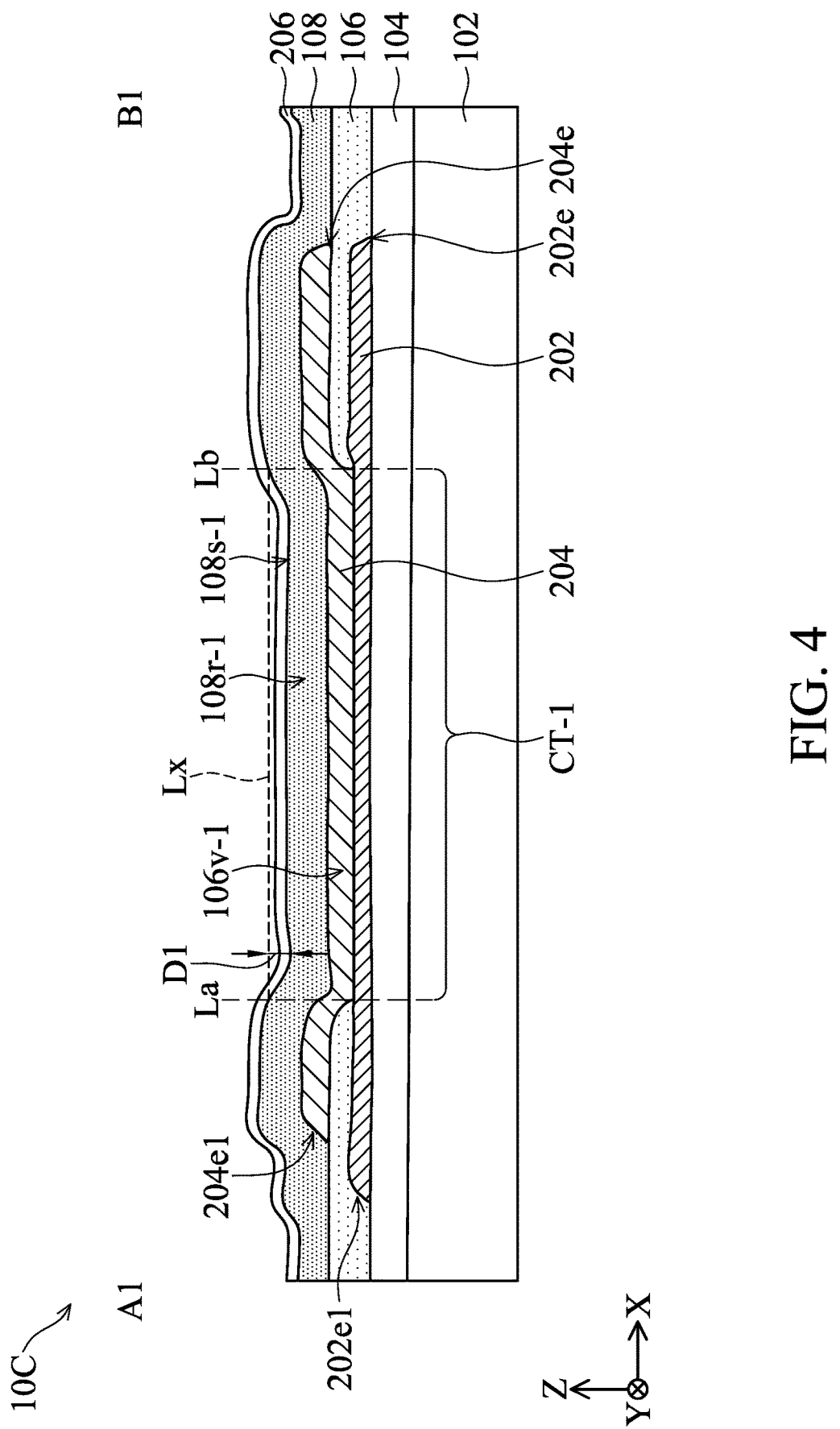
FIG. 4 is a cross-sectional diagram of a connection structure corresponding to the section line A1-B1 of FIG. 2 in accordance with some embodiments of the present disclosure.
Figure 5:
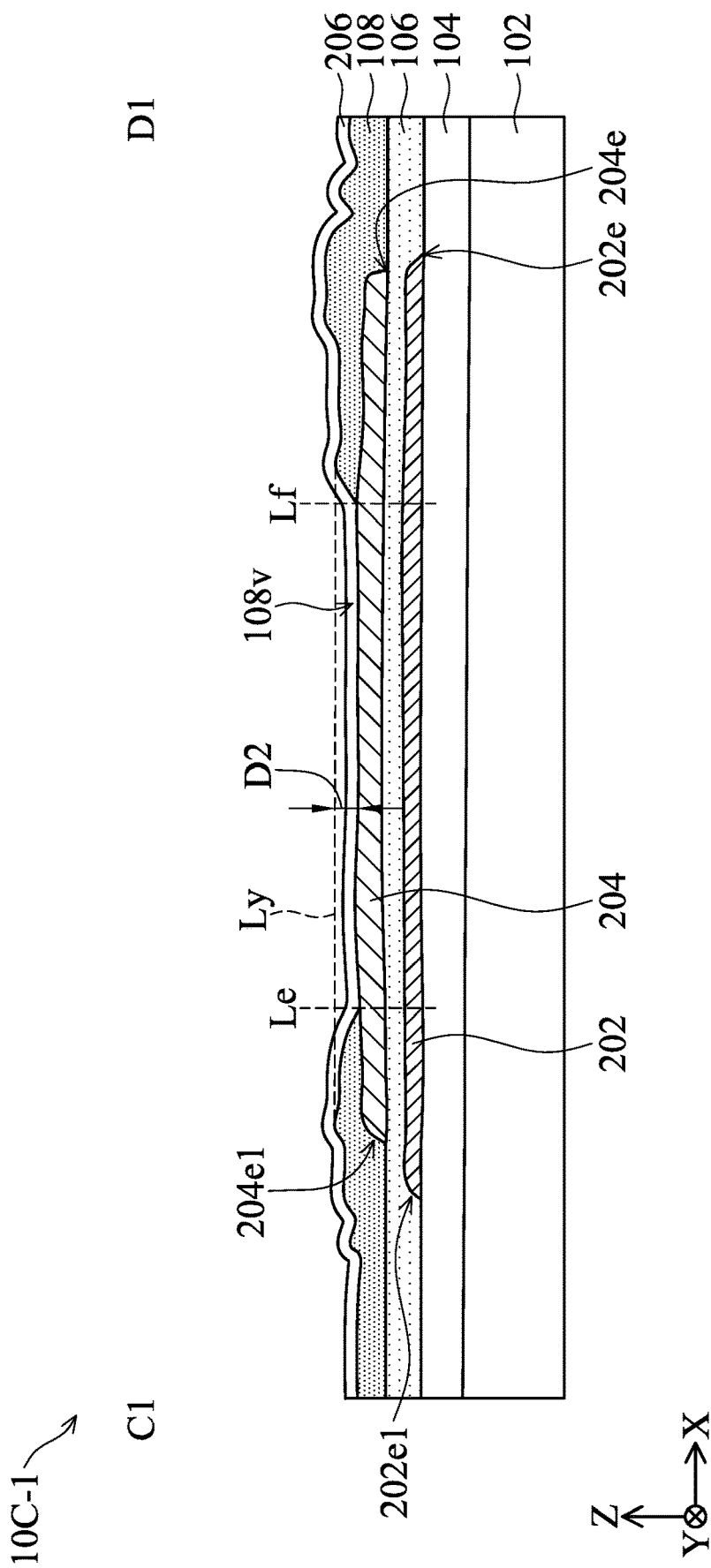
FIG. 5 is a cross-sectional diagram of a connection structure corresponding to the section line C1-D1 of FIG. 2 in accordance with some embodiments of the present disclosure.

FIG. 4 is a cross-sectional diagram of the connection structure 10C corresponding to the section line A1-B1 of FIG. 2 in accordance with some embodiments of the present disclosure. FIG. 5 is a cross-sectional diagram of the connection structure 10C corresponding to the section line C1-D1 of FIG. 2 in accordance with some embodiments of the present disclosure. FIG. 4 shows the cross-sectional diagram including the first through-hole 106v-1, and FIG. 5 shows the cross-sectional diagram including the second through-hole 108v. As shown in FIG. 4 and FIG. 5, the depth D1 of the first recessed portion 108r-1 and the depth D2 of the second recessed portion 108r-2 may be measured under different cross-sectional diagrams, but the extending directions of the section lines of the different cross-sectional diagrams both extend along, for example, the first direction Y. In FIG. 4 and FIG. 5, the definitions of the depth D1 of the first recessed portion 108r-1 and the depth D2 of the second recessed portion 108r-2 may refer to the above definitions, and the design relationship between the depth D1 and the depth D2 may also refer to the above descriptions.

It should be understood that, in accordance with the embodiments of the present disclosure, an optical microscope (OM), a scanning electron microscope (SEM), a film thickness profiler (α-step), an ellipsometer, or other suitable methods can be used to measure the depth, thickness, width or height of an element, or the distance or spacing between elements. Specifically, in accordance with some embodiments, a scanning electron microscope can be used to obtain a cross-sectional image including the element to be measured, and the depth, thickness, width or height of an element, or the distance or spacing between elements in the image can be measured.

In addition, as shown in FIG. 3, the third conductive pad 206 may be disposed on the second insulating layer 108 and electrically connected to the second conductive pad 204 through the second through-hole 108v, and the third conductive pad 206 may extend on the surface 108s-1 of the first recessed portion 108r-1 and/or the surface 108s-2 of the second recessed portion 108r-2, but it is not limited thereto. In other words, the third conductive pad 206 may be disposed on the surface 108s-1 of the first recessed portion 108r-1 and/or the surface 108s-2 of the second recessed portion 108r-2. Moreover, the third conductive pad 206 may be disposed on the second insulating layer 108 and in the second through-hole 108v, so that the third conductive pad 206 may be in contact with and electrically connected to the second conductive pad 204 exposed by the second through-hole 108v. In accordance with some embodiments, in the normal direction Z of the substrate 102, the second through-hole 108v does not overlap the first recessed portion 108r-1 and the second recessed portion 108r-2.

In accordance with some embodiments, the third conductive pad 206 may include a transparent conductive material, for example, may include indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), another suitable transparent conductive material or a combination thereof, but it is not limited thereto. The third conductive pad 206 may have a single-layer or multi-layer structure, and the materials of the multi-layers may be the same or different.

In accordance with some embodiments, the insulating layer 104, the first insulating layer 106 and/or the second insulating layer 108 may be formed by a coating process, a chemical vapor deposition process, a physical vapor deposition process, an evaporation process, a sputtering process, another suitable process, or a combination thereof. Furthermore, the first through-hole 106v-1, the third through-hole 106v-2 and/or the second through-hole 108v may be formed by one or more photolithography processes and/or etching processes.

As mentioned above, the third conductive pad 206 may cover the second conductive pad 204 exposed by the second through-hole 108v to reduce the risk of oxidation of the second conductive pad 204 when exposed to the air. It should be noted that, in accordance with the embodiments of the present disclosure, in addition to covering the second conductive pad 204, the third conductive pad 206 further extends onto the first recessed portion 108r-1 and/or the second recessed portion 108r-2 of the second insulating layer 108 as described above. In accordance with some embodiments, the third conductive pad 206 may have an irregular-shaped surface. By forming the third conductive pad 206 on the structure with the height difference as described above (e.g., the second insulating layer 108 having the first recessed portion 108r-1 and/or the second recessed portion 108r-2), the contact area between the third conductive pad 206 and the underlying structure (e.g., the second insulating layer 108) can be increased, and the chance of peeling off of the third conductive pad 206 can be reduced.

In accordance with some embodiments, the first recessed portion 108r-1 and the second recessed portion 108r-2 may be located at two ends of the first conductive pad 202. For example, the first recessed portion 108r-1 and the second recessed portion 108r-2 may be arranged along the first direction Y, and the first direction Y may be the extending direction of the long axis LA of the first conductive pad 202, but it is not limited thereto. With the above structural design, the risk of peeling off the third conductive pad 206 from the end portion of the first conductive pad 202 can be reduced.

Moreover, as shown in FIG. 3 and FIG. 4, at the position corresponding to the first through-hole 106v-1 (i.e. range of projection of the first through-hole 106v-1 to the substrate 102), the first conductive pad 202 may have the contact portion CT-1, and the position of the contact portion CT-1 may overlap the first through-hole 106v-1, so that the first conductive pad 202 may be in contact or electrically connected to the second conductive pad 204 through the first through-hole 106v-1. Similarly, at the position corresponding to the third through-hole 106v-2 (i.e. the range of projection of the third through-hole 106v-2 to the substrate 102), the first conductive pad 202 may have the contact portion CT-2, and the position of the contact portion CT-2 may overlap the third through-hole 106v-2, so that the first conductive pad 202 may be in contact or electrically connected to the second conductive pad 204 through the third through-hole 106v-2.

In addition, as shown in FIG. 3 and FIG. 5, at the position corresponding to the second through-hole 108v (i.e. the range of projection of the second through-hole 108v to the substrate 102), a part of the first insulating layer 106 may be disposed between the first conductive pad 202 and the second conductive pad 204, so that the first conductive pad 202 corresponding to the position of the second through-hole 108v is not in contact with the second conductive pad 204. In addition, the third conductive pad 206 may be in contact or electrically connected to the second conductive pad 204 through the second through-hole 108v.

As shown in FIG. 4 and FIG. 5, in accordance with some embodiments, the first conductive pad 202 may have an edge 202e and an edge 202e1 in the second direction X, and the edge 202e and the edge 202e1 may be opposite to each other. In accordance with some embodiments, the second conductive pad 204 may have an edge 204e and an edge 204e1 in the second direction X, and the edge 204e and the edge 204e1 may be opposite to each other. In accordance with some embodiments, the edge 202e may or may not extend beyond the edge 204e of the second conductive pad 204 in the second direction X. In accordance with some embodiments, the edge 202e1 may or may not extend beyond edge 204e1 in the second direction X. In accordance with some embodiments, the relative relation between the edge 204e and the edge 202e in the second direction X (e.g., extend beyond or not) may be the same as or different from the relative relation between the edge 204e1 and the edge 202e1 in the second direction X (e.g., extend beyond or not). For example, as shown in FIG. 4, in the second direction X, the edge 202e may be substantially aligned with the edge 204e, and the edge 202e may exceed the edge 204e, but it is not limited thereto. In accordance with some embodiments, the edge 202e, edge 204e, edge 202e1 and/or edge 204e1 may have arc-shaped edges.

As described above, the first conductive pad 202 may have the short axis SA extending along the second direction X, and the third conductive pad 206 may extend beyond the edge 204e (or the edge 204e1) of the second conductive pad 204 in the second direction X. In accordance with some embodiments, the third conductive pad 206 may extend beyond the edge 202e (or the edge 202e1) of the first conductive pad 202 in the second direction X. In other words, in the second direction X, the third conductive pad 206 may cover the edge 202e (or the edge 202e1) of the first conductive pad 202 and/or the edge 204e (or the edge 204e1) of the second conductive pad 204, but it is not limited thereto. With the above configuration, the adhesion of the third conductive pad 206 at the edge of the short axis SA of the first conductive pad 202 can be increased, and the risk of peeling off of the third conductive pad 206 can also be reduced.

In accordance with some other embodiments (not illustrated), in the first direction Y, the third conductive pad 206 may extend beyond the edge (not labeled) of the first conductive pad 202 and/or the edge (not labeled) of the second conductive pad 204, but it is not limited thereto. Therefore, the adhesion of the third conductive pad 206 at the edge of the long axis LA of the first conductive pad 202 can be increased, and the risk of peeling off of the third conductive pad 206 can also be reduced. In accordance with some other embodiments (not illustrated), the third conductive pad 20 may extend beyond the edge (not labeled) of the second conductive pad 204 in other directions (e.g., directions other than the first direction Y or the second direction X), so as to increase the adhesion of the third conductive pad 206 and also reduces the risk of peeling off of the third conductive pad 206.

Figure 6:
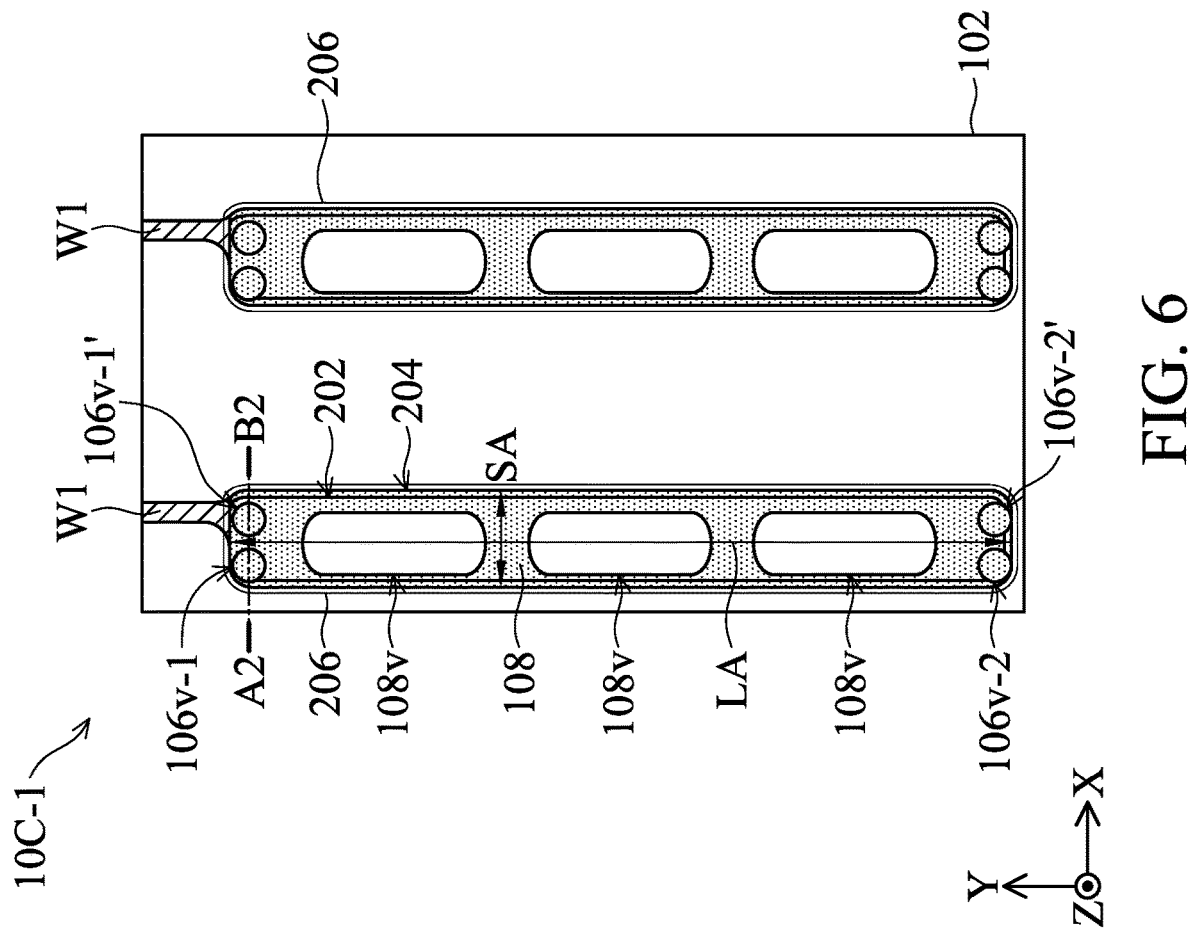
FIG. 6 is a top-view diagram of a connection structure in accordance with some embodiments of the present disclosure.
Figure 7:
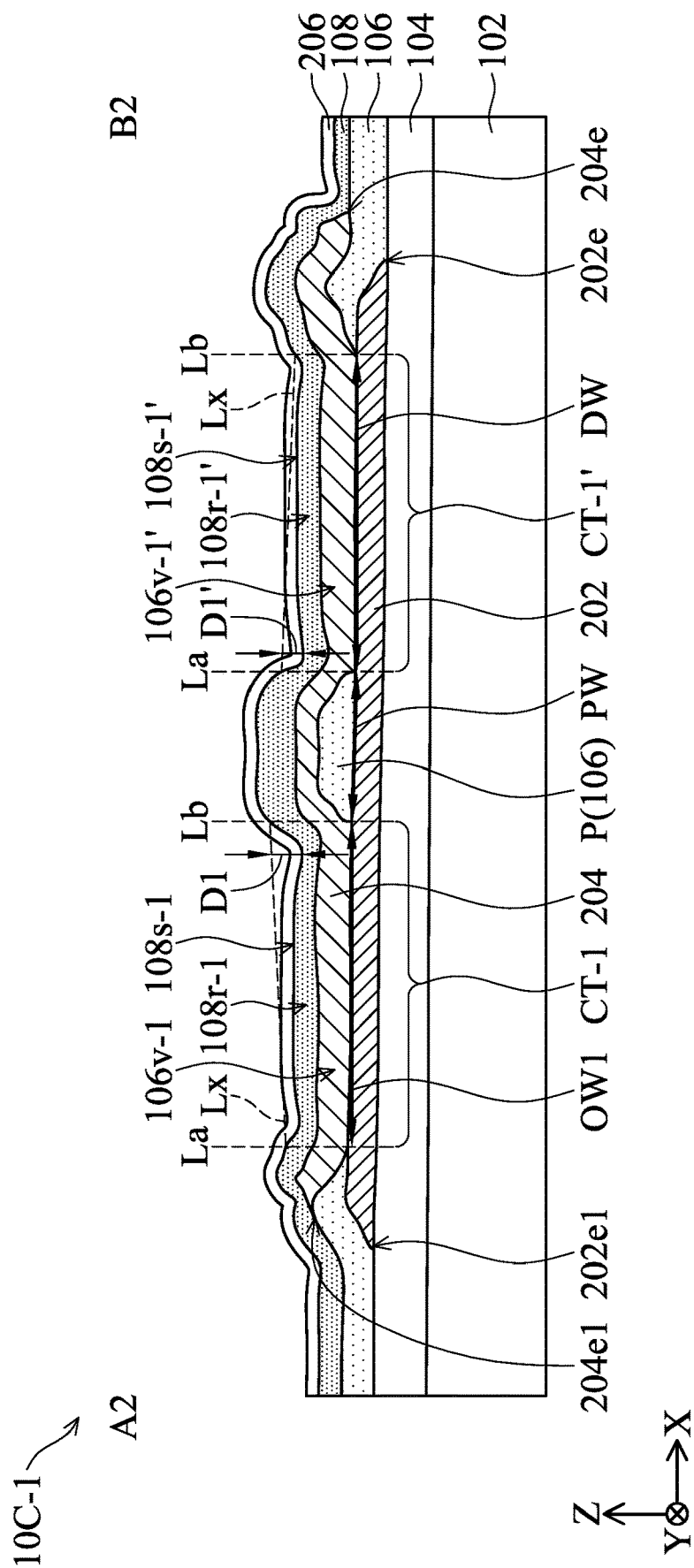
FIG. 7 is a cross-sectional diagram of a connection structure corresponding to the section line A2-B2 of FIG. 6 in accordance with some embodiments of the present disclosure.

Next, refer to FIG. 6 and FIG. 7. FIG. 6 is a top-view diagram of a connection structure 10C-1 in accordance with some other embodiments of the present disclosure. FIG. 7 is a cross-sectional diagram of the connection structure 10C-1 corresponding to the section line A2-B2 of FIG. 6 in accordance with some embodiments of the present disclosure. It should be understood that the same or similar components or elements in above and below contexts are represented by the same or similar reference numerals. The materials, manufacturing methods and functions of these components or elements are the same or similar to those described above, and thus will not be repeated herein.

In accordance with this embodiment, in addition to the first through-hole 106v-1 and the third through-hole 106v-2, the first insulating layer 106 may further include other through-holes (e.g., the first through-hole 106v-1' and/or the third through-hole 106v-2'). That is, the first insulating layer 106 corresponding to the two ends of the first conductive pad 202 may each have a plurality of through-holes, such as two through-holes, but it is not limited thereto. In accordance with this embodiment, the first through-hole 106v-1 and the first through-hole 106v-1' may correspond to one end of the first conductive pad 202, and the first through-hole 106v-1 and the first through-hole 106v-1' may be arranged substantially along the second direction X, but it is not limited thereto. In accordance with this embodiment, the third through-hole 106v-2 and the third through-hole 106v-2' may correspond to the other end of the first conductive pad 202, and the third through-hole 106v-2 and the third through-hole 106v-2' may be arranged substantially along the second direction X, but it is not limited thereto. In accordance with other embodiments, the numbers of through-holes of the first insulating layer 106 corresponding to the two ends of the first conductive pad 202 may be the same or different. Furthermore, in accordance with this embodiment, the second insulating layer 108 may include a plurality of second through-holes 108v. In accordance with this embodiment, the plurality of second through-holes 108v of the second insulating layer 108 may be arranged substantially along the first direction Y, but it is not limited thereto. In accordance with other embodiments (not illustrated), the plurality of second through-holes 108v of the second insulating layer 108 is not limited to only one row. It should be understood that the numbers of the through-holes of the first insulating layer 106 and the second insulating layer 108 are not limited to those shown in the figures. According to different embodiments, the first insulating layer 106 and the second insulating layer 108 may have other suitable numbers of through-holes. Furthermore, the number of through-holes of the first insulating layer 106 corresponding to the two ends of the long axis LA of the first conductive pad 202 may be the same or different. In accordance with this embodiment, the size of the second through-hole 108v of the second insulating layer 108 may be larger than the size of the through-hole (e.g., the first through-hole 106v-1' and/or the third through-hole 106v-2') of the first insulating layer 106, but it is not limited thereto. In accordance with this embodiment, the profile of the second through-hole 108v of the second insulating layer 108 may have an arc-shaped edge, but it is not limited thereto. In accordance with this embodiment, the profile of the through-holes of the first insulating layer 108 may have an arc-shaped, but it is not limited thereto. In accordance with this embodiment, the profile of the second through-hole 108v may have different widths in the first direction Y and the second direction X, but it is not limited thereto. For example, the width of the profile of the second through-hole 108v in the first direction Y may be greater than the width in the second direction X, but it is not limited thereto. In accordance with other embodiments (not illustrated), the width of the profile of the second through-hole 108v in the first direction Y and the second direction X may be substantially the same. That is, the profile of the second through-hole 108v may be substantially circular, but it is not limited thereto.

As shown in FIG. 7, in the second direction X, the first through-hole 106v-1 and the first through-hole 106v-1' may be separated, for example, by a portion P of the first insulating layer 106. The second conductive pad 204 may be disposed on the first insulating layer 106 and electrically connected to one end of the first conductive pad 202 through the first through-hole 106v-1 and the first through-hole 106v-1'. Similarly, the second conductive pad 204 may also be electrically connected to the other end of the first conductive pad 202 through the third through-hole 106v-2 and the third through-hole 106v-2'. As shown in FIG. 7, the first conductive pad 202 may include a contact portion CT-1 and a contact portion CT-1', and the second conductive pad 204 may be in contact with and electrically connected to the contact portion CT-1 through the first through-hole 106v-1, and the second conductive pad 204 may be in contact with and electrically connected to the contact portion CT-1' through the first through-hole 106v-1'. In accordance with this embodiment, the first through-holes 106v-1 and the first through-holes 106v-1' may be arranged along the second direction X. In accordance with some embodiments, in the second direction X, a width PW of the portion P of the first insulating layer 106 located between the first through-hole 106v-1 and the first through-hole 106v-1' may be smaller than or equal to a width OW1 of the first through-hole 106v-1 or a width OW2 of the first through-hole 106v-1', but it is not limited thereto. The width PW of the portion P of the first insulating layer 106 can be defined as the width of the surface of the portion P in contact with the first conductive pad 202 in a cross-section. The width OW1 of the first through-hole 106v-1 substantially may be the width of the surface of the first conductive pad 202 exposed by the first through-hole 106v-1. The width OW2 of the first through-hole 106v-1' substantially may be the width of the surface of the first conductive pad 202 exposed by the first through-hole 106v-1'. In accordance with some embodiments, the portion P of the first insulating layer 106 between the first through-hole 106v-1 and the first through-hole 106v-1' may have an arc-shaped surface.

In accordance with this embodiment, at one end of the short axis SA of the first conductive pad 202, the edge 204e of the second conductive pad 204 may extend beyond the edge 202e of the first conductive pad 202. At the other end of the short axis SA of the first conductive pad 202, the edge 202e1 of the first conductive pad 202 may extend beyond the edge 204e1 of the second conductive pad 204, but it is not limited thereto.

Furthermore, the second insulating layer 108 may include a first recessed portion 108r-1 and a first recessed portion 108r-1'. In the normal direction Z of the substrate 102, the first recessed portion 108r-1 may overlap the first through-hole 106v-1, and the first recessed portion 108r-1' may overlap the first through-hole 106v-1'. The first recessed portion 108r-1 and the first recessed portion 108r-1' may be arranged along the second direction X (i.e. the extending direction X of the short axis SA of the first conductive pad 202). As shown in FIG. 7, the first recessed portion 108r-1 may have a depth D1, the first recessed portion 108r-1' may have a depth D1', and the depth D1 of the first recessed portion 108r-1 may be the same as or different from the depth D1' of the first recessed portion 108r-1'. The definitions of the first recessed portion 108r-1' and the depth D1' are similar to the definitions of the aforementioned first recessed portion 108r-1 and the depth D1, and thus are not repeated here.

The third conductive pad 206 may extend on the surface 108s-1 of the first recessed portion 108r-1 and the surface 108s-1' of the first recessed portion 108r-1'. In accordance with this embodiment, the third conductive pad 206 not only may extend onto the first recessed portion 108r-1 of the second insulating layer 108, but also may extend onto the first recessed portion 108r-1' of the second insulating layer 108. By arranging a plurality of recess portions in the second insulating layer 108 and extending the third conductive pad 206 to these recess portions, the contact area between the third conductive pad 206 and the underlying structure (e.g., the second insulating layer 108) can be increased, and the adhesion of the third conductive pad 206 to the underlying structure can be increased. Therefore, the risk of peeling off of the third conductive pad 206 can be reduced. Similarly, the second insulating layer 108 may include two second recess portions (not illustrated), and in the normal direction Z of the substrate 102, the two recess portions (not illustrated) may overlap the second through-holes 106v-2 and the second through-hole 106v-2, respectively. Similarly, the third conductive pad 206 may extend on the surfaces (not illustrated) of the two second recess portions (not illustrated).

Figure 8:
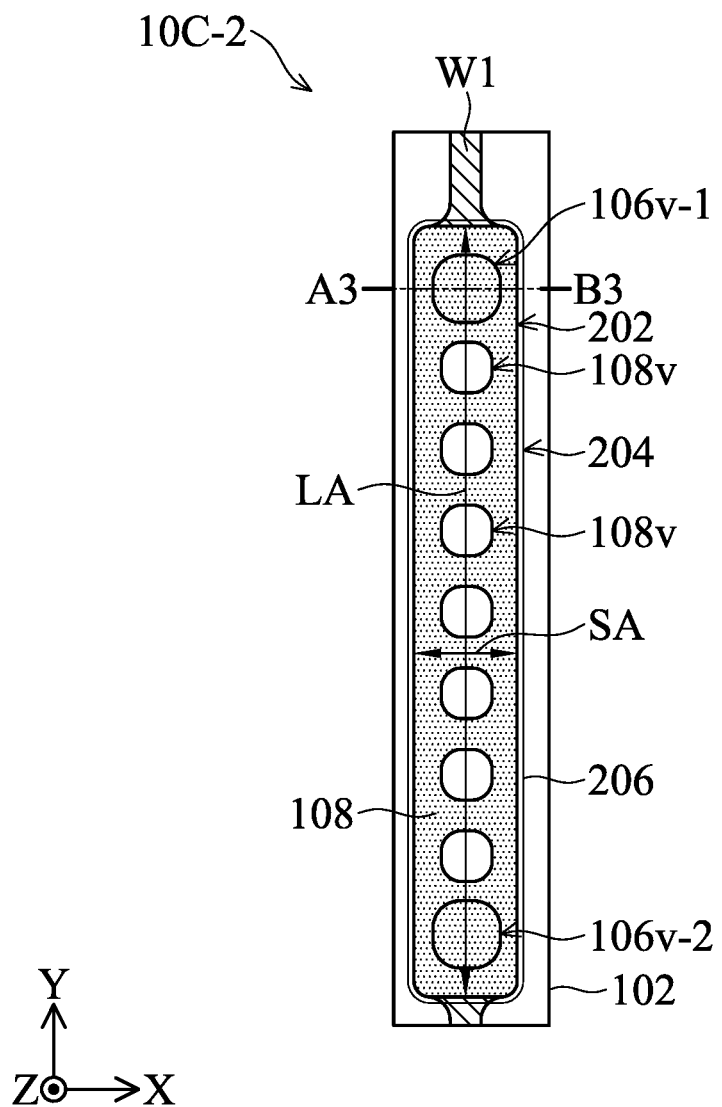
FIG. 8 is a top-view diagram of a connection structure in accordance with some embodiments of the present disclosure.
Figure 9:
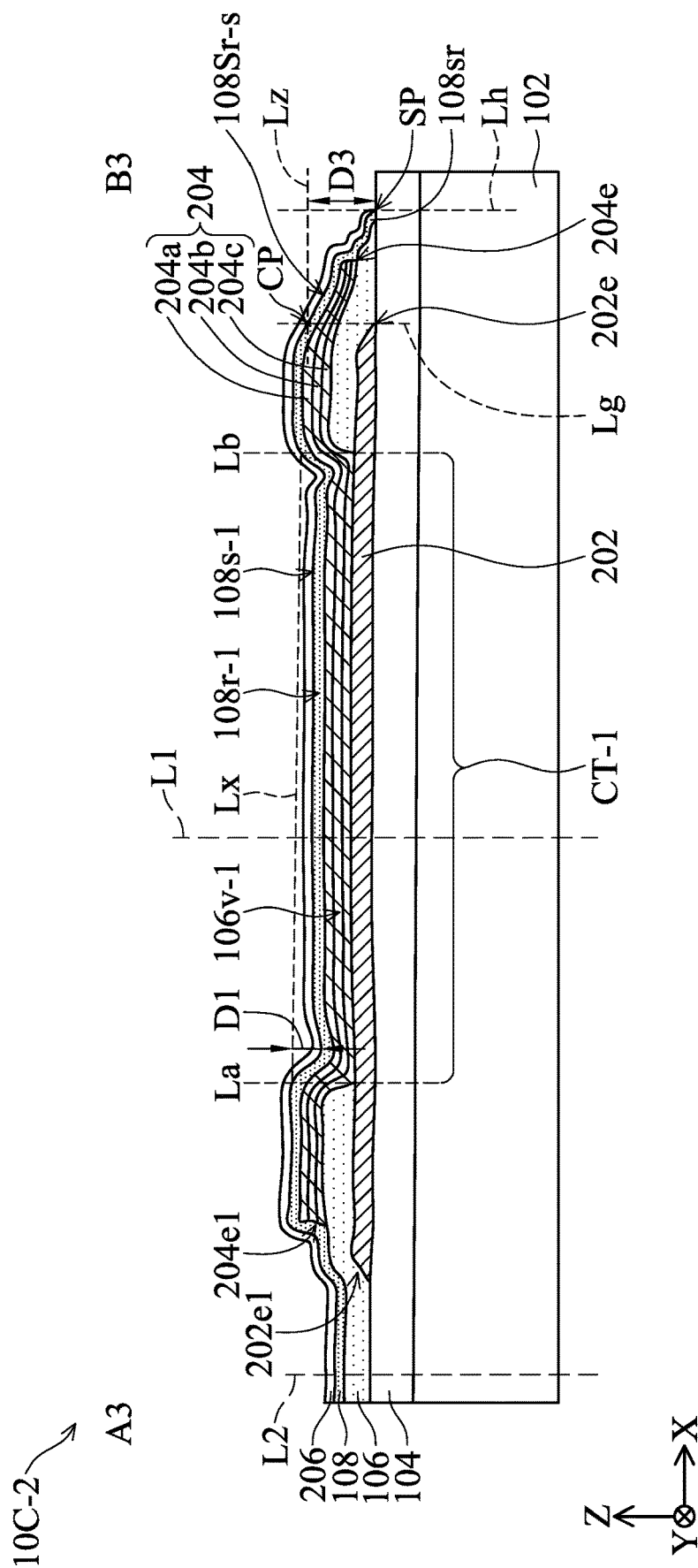
FIG. 9 is a cross-sectional diagram of a connection structure corresponding to the section line A3-B3 of FIG. 8 in accordance with some embodiments of the present disclosure.

Next, refer to FIG. 8 and FIG. 9. FIG. 8 is a top-view diagram of a connection structure 10C-2 in accordance with some other embodiments of the present disclosure. FIG. 9 is a cross-sectional diagram of the connection structure 10C-2 corresponding to the section line A3-B3 of FIG. 8 in accordance with some embodiments of the present disclosure.

The first insulating layer 106 of the connection structure 10C-2 may include a first through-hole 106v-1 and a third through-hole 106v-2, and the second insulating layer 108 may include a plurality of second through-holes 108v along the first direction X. In accordance with this embodiment, the size (e.g., area) of the first through-hole 106v-1 may be larger than the size (e.g., area) of the second through-hole 108v, but it is not limited thereto. In accordance with this embodiment, the size (e.g., area) of the third through-hole 106v-2 may be larger than the size (e.g., area) of the second through-hole 108v, but it is not limited thereto. In accordance with this embodiment, the number of through-holes of the first insulating layer 106 may be less than the number of through-holes of the second insulating layer 108 (e.g., the second through-holes 108v). In accordance with this embodiment, the width of the profile of the second through-hole 108v in the first direction Y and the second direction X may be substantially the same, but it is not limited thereto. As shown in FIG. 9, in accordance with this embodiment, the second conductive pad 204 may have a multi-layer structure, for example, including a sub-layer 204a, a sub-layer 204b and/or a sub-layer 204c, but it is not limited thereto. The materials of sublayer 204a, sublayer 204b, and/or sublayer 204c may be the same or different. In accordance with some embodiments, the materials of the sub-layer 204a, the sub-layer 204b, and the sub-layer 204c may be molybdenum, aluminum, and molybdenum, respectively, but they are not limited thereto. In accordance with some embodiments (not illustrated), the first conductive pad 202 may have a multi-layer structure. In accordance with some embodiments, in the normal direction Z of the substrate 102, the thickness of the second conductive pad 204 may be the same as or different from the thickness of the first conductive pad 202. In accordance with some embodiments, in the normal direction Z of the substrate 102, the thickness of the second conductive pad 204 may be greater than the thickness of the first conductive pad 202. In accordance with some embodiments, in the normal direction Z of the substrate 102, the thickness of the second conductive pad 204 may be smaller than the thickness of the first conductive pad 202. The thickness of the first conductive pad 202 or the thickness of the second conductive pad 204 can be measured along a virtual line L1 respectively, and the virtual line L1 is parallel to the normal direction Z of the substrate 102 and passes through the first through-hole 106v-1.

In accordance with some embodiments, in the normal direction Z of the substrate 102, the thickness of the first insulating layer 106 may be the same as or different from the thickness of the second insulating layer 108. In accordance with some embodiments, in the normal direction Z of the substrate 102, the thickness of the first insulating layer 106 may be greater than the thickness of the second insulating layer 108. In accordance with some embodiments (not illustrated), in the normal direction Z of the substrate 102, the thickness of the first insulating layer 106 may be smaller than the thickness of the second insulating layer 108. The thickness of the first insulating layer 106 and the second insulating layer 108 can be measured along a virtual line L2. The virtual line L2 is parallel to the normal direction Z of the substrate 102 and does not pass through the first conductive pad 202 and the second conductive pad 204.

In accordance with this embodiment, at one end of the short axis SA of the first conductive pad 202, the edge 204e of the second conductive pad 204 may extend beyond the edge 202e of the first conductive pad 202. At the other end of the short axis SA of the 202 of the first conductive pad 202, the edge 202e1 of the first conductive pad 202 may extend beyond the edge 204e1 of the second conductive pad 204, but it is not limited thereto.

As shown in FIG. 9, the second insulating layer 108 may have a side recessed portion 108sr, and the side recessed portion 108sr may extend beyond the edge (e.g., the edge 204e or the edge 204e1) of the second conductive pad 204 in the second direction X (i.e. the extending direction of the short axis SA of the first conductive pad 202). In addition, the third conductive pad 206 may extend on a surface 108sr-s of the side recessed portion 108sr. The definition of the side recessed portion 108sr is as follows. First, in a cross-section, a virtual line Lg is obtained that passes through the edge of the first conductive pad 202 (e.g., the edge 202e or the edge 202e1) and extends substantially along the normal direction Z of the substrate 102. The virtual line Lg and the surface of the second insulating layer 108 intersect at an intersection point CP, and the intersection point CP is defined as the starting end of the side recessed portion 108sr. In addition, under the same cross-section, the outer edge of the third conductive pad 206 is projected onto the second insulating layer 108 to obtain a side end point SP, and a virtual line Lh that passes through the side end point SP and extends substantially along the normal direction Z of the substrate 102 is obtained. The portion of the second insulating layer 108 located within the range of the virtual line Lg and the virtual line Lh is defined as the side recessed portion 108sr. Moreover, the side recessed portion 108sr may have a surface 108sr-s that is away from the substrate 102. In other words, the intersection point CP may be the starting point of the surface 108sr-s of the side recessed portion 108sr, and the side end point SP may be the end point of the surface 108sr-s of the side recessed portion 108sr. In accordance with some embodiments, the surfaces 108sr-s of the side recessed portion 108sr may have a stepped profile, but it is not limited thereto. In accordance with some embodiments, the surfaces 108sr-s of the side recessed portion 108sr may have a wavy or irregular profile, but it is not limited thereto.

In accordance with some embodiments, the side recessed portion 108sr may have a depth D3, and the depth D3 of the side recessed portion 108sr may be greater than the depth D1 of the first recessed portion 108r-1. The definition of the depth D1 of the first recessed portion 108r-1 may refer to the above. The depth D3 of the side recessed portion 108sr is defined as follows. First, a virtual line Lz that passes through the above-mentioned intersection point CP and extend substantially perpendicular to the normal direction Z of the substrate 102 is obtained. Next, in the normal direction Z of the substrate 102, the distance between the virtual line Lz and the side end point SP is defined as the depth D3.

In accordance with some implementations, the depth D3 of the side recessed portion 108sr may be between 500 nm and 1200 nm (i.e. 500 nm≤depth D3≤1200 nm), or between 550 nm and 1100 nm, for example, 600 nm, 700 nm, 800 nm, 900 nm or 1000 nm, but it is not limited thereto. In accordance with some embodiments, the depth D3 of the side recessed portion 108sr may be different from the depth D1 of the first recessed portion 108r-1 or the depth D2 of the second through-hole 108v. In accordance with some embodiments, the depth D3 of the side recessed portion 108sr may be greater than the depth D1 of the first recessed portion 108r-1 or the depth D2 of the second through-hole 108v. With the above structural design of the side recessed portion 108sr, the contact area between the third conductive pad 206 and the second insulating layer 108 at the edge can be increased. Similarly, the side recessed portion 108sr having a stepped or wavy profile can also increase the contact area between the third conductive pad 206 and the second insulating layer 108. In this way, the adhesion between the third conductive pad 206 and its underlying structure can be improved, thereby reducing the risk of peeling off of the third conductive pad 206.

Figure 10:
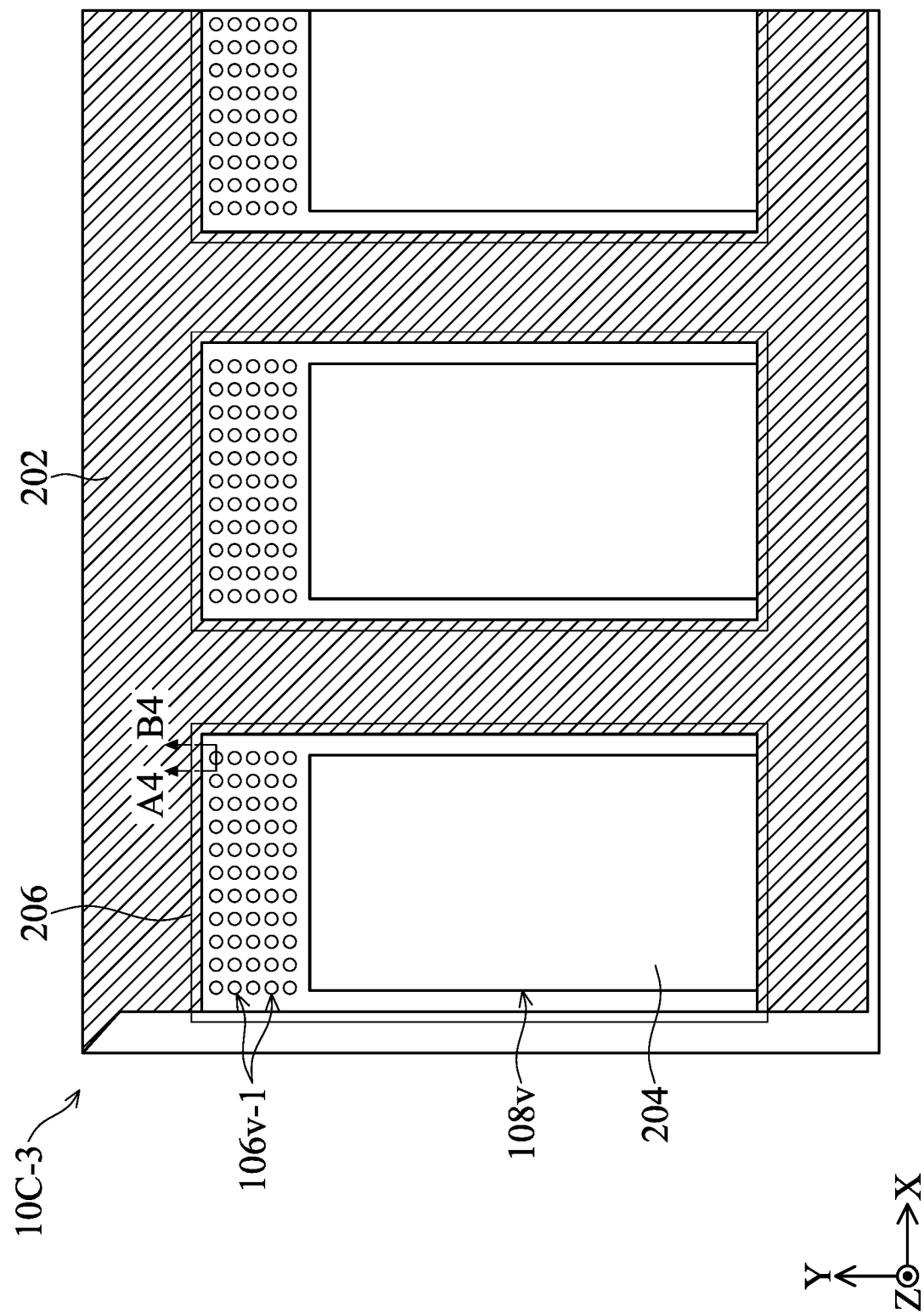
FIG. 10 is a top-view diagram of a connection structure in accordance with some embodiments of the present disclosure.
Figure 11:
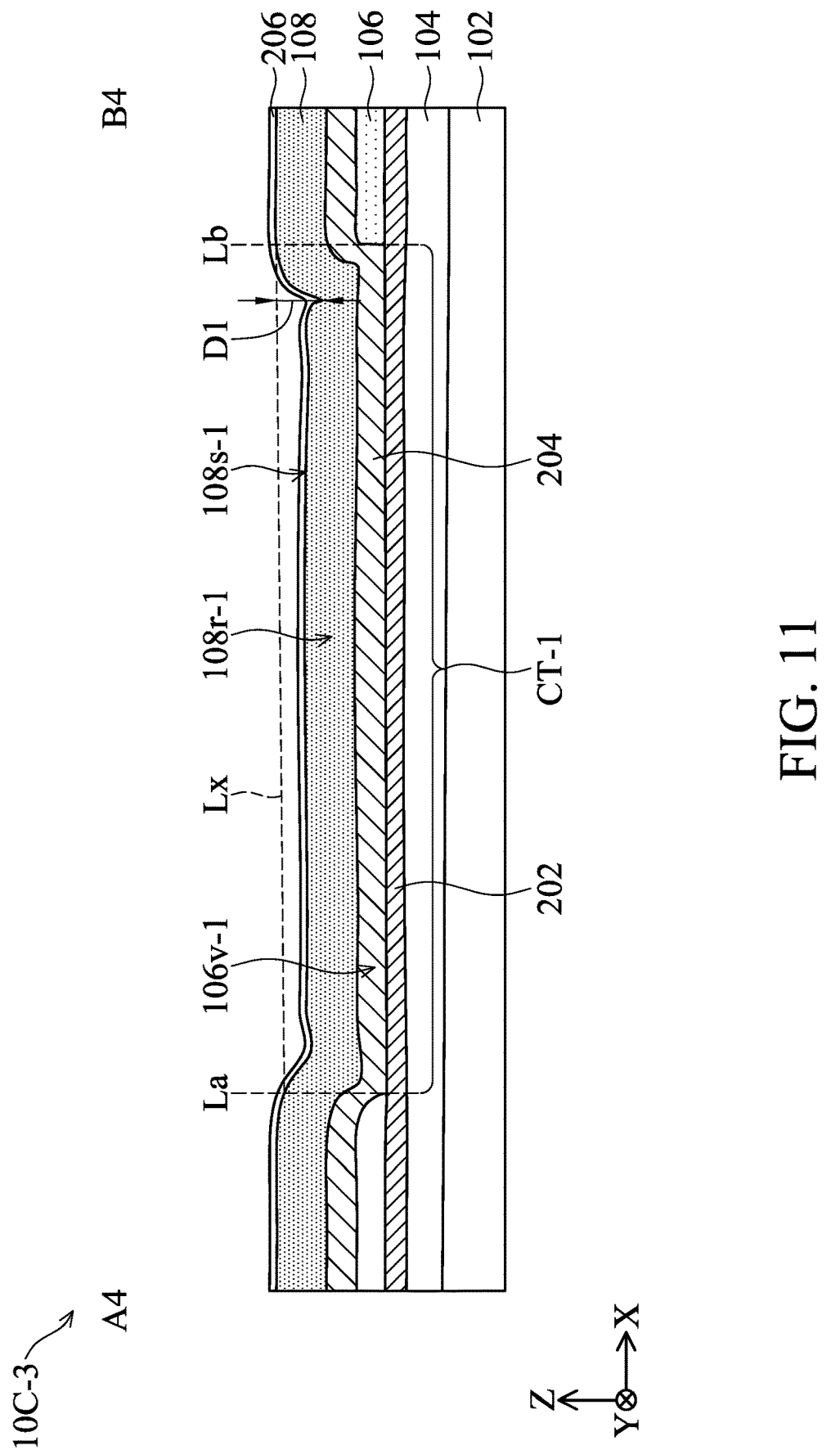
FIG. 11 is a cross-sectional diagram of a connection structure corresponding to the section line A4-B4 of FIG. 10 in accordance with some embodiments of the present disclosure.

Refer to FIG. 10 and FIG. 11. FIG. 10 is a top-view diagram of a connection structure 10C-3 in accordance with some embodiments of the present disclosure. FIG. 11 is a cross-sectional diagram of the connection structure 10C-3 corresponding to the section line A4-B4 of FIG. 10 in accordance with some embodiments of the present disclosure.

In accordance with this embodiment, the connection structure 10C-3 may be electrically connected to a flexible printed circuit board (FPC) or a chip on film (COF) package, but it is not limited thereto. As shown in FIG. 10, in accordance with some embodiments, a plurality of second conductive pads 204 may be disposed on the same first conductive pad 202. Moreover, in a region corresponding to one second conductive pad 204, the first insulating layer 106 may include a plurality of first through-holes 106v-1, and the second insulating layer 108 may include at least one second through-hole 108v, but it is not limited thereto. In accordance with this embodiment, the plurality of first through-holes 106v-1 may be arranged in an array, but it is not limited thereto.

As shown in FIG. 11, the second conductive pad 204 may be disposed on the first insulating layer 106 and electrically connected to the first conductive pad 202 through the first through-hole 106ν-1. Furthermore, the first conductive pad 202 may include at least one contact portion CT-1, and the second conductive pad 204 may be in contact with the contact portion CT-1 through the first through-hole 106ν-1. Moreover, the second insulating layer 108 may include a first recessed portion 108r-1, and in the normal direction Z of the substrate 102, the first recessed portion 108r-1 may overlap the first through-hole 106ν-1. The third conductive pad 206 may extend on the surface 108s-1 of the first recessed portion 108r-1.

Figure 12:
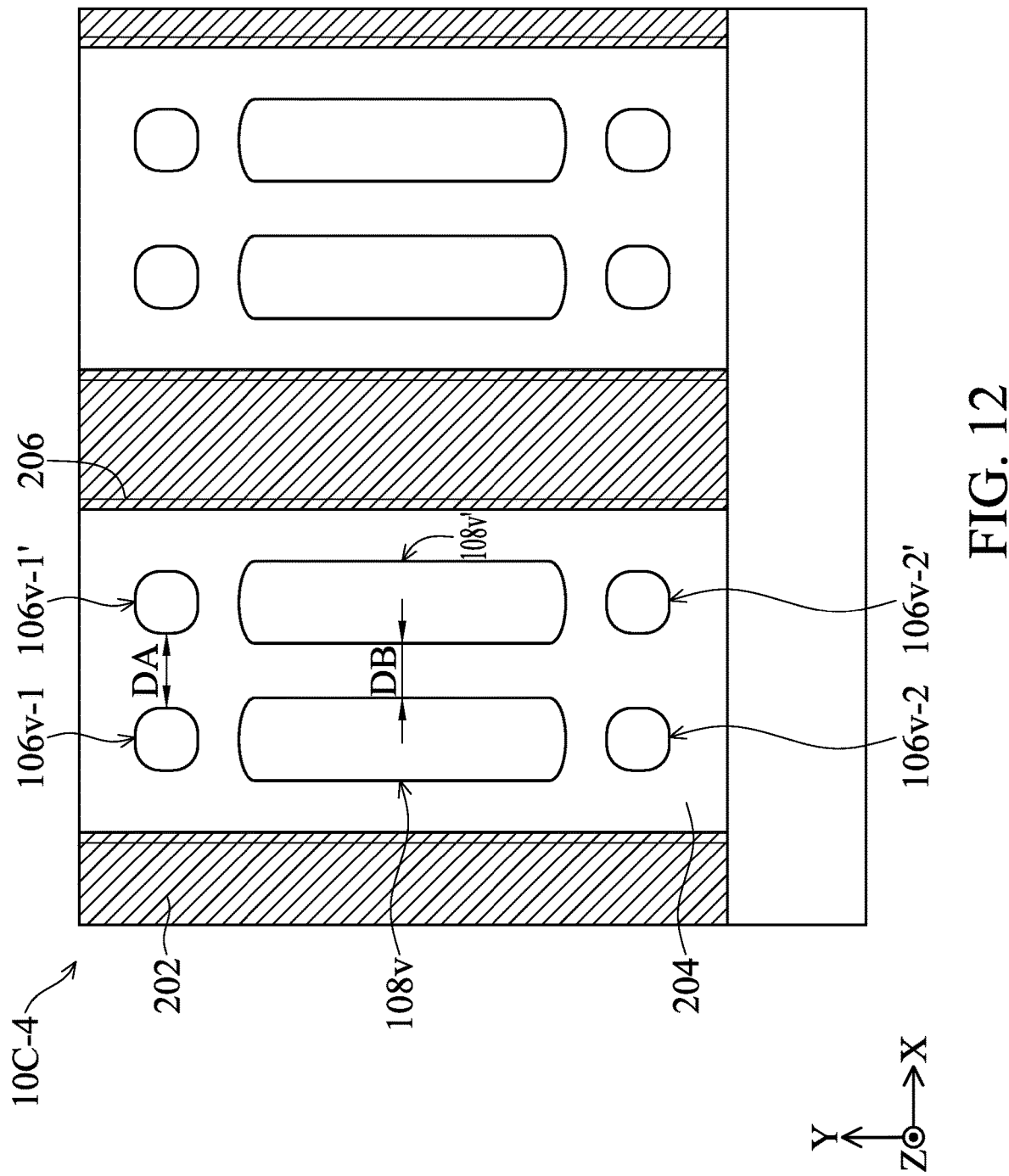
FIG. 12 is a top-view diagram of a connection structure in accordance with some embodiments of the present disclosure.

Next, refer to FIG. 12, which is a top-view diagram of a connection structure 10C-4 in accordance with some embodiments of the present disclosure. As shown in FIG. 12, a plurality of second conductive pads 204 may be disposed on the same first conductive pad 202. In a region corresponding to one second conductive pad 204, in addition to the first through-hole 106ν-1 and the third through-hole 106ν-2, the first insulating layer 106 may further include the first through-hole 106ν-1' and the third through-hole 106ν-2', and the second insulating layer 108 may include the second through-hole 108ν and a second through-hole 108ν'. In accordance with this embodiment, in the first direction X, the second through-hole 108ν may be located between the first through-hole 106ν-1 and the third through-hole 106ν-2, and another second through-hole 108ν' may be located between the first through-hole 106ν-1' and the third through-hole 106ν-2'. In accordance with this embodiment, in the second direction X, a minimum distance DA between the first through-hole 106ν-1 and the first through-hole 106ν-1' may be different from a minimum distance DB between the second through-hole 108ν and the second through-hole 108ν'. In accordance with this embodiment, in the second direction X, the minimum distance DA between the first through-hole 106ν-1 and the first through-hole 106ν-1' may be greater than the minimum distance DB between the second through-hole 108ν and the second through-hole 108ν'.

To summarize the above, in accordance with the embodiments of the present disclosure, the provided connection structure includes the conductive pad extending in the recessed structure, thereby increasing the contact area between the conductive pad and the underlying structure. The adhesion between the conductive pad and the underlying structure can be improved. The risk of cracks or peeling off of the conductive pad, or even peeling of components from the substrate can be reduced, thereby improving the reliability of the electronic device.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A connection structure, comprising:
a first conductive pad;
a first insulating layer disposed on the first conductive pad and comprising a first through-hole and a third through-hole;
a second conductive pad disposed on the first insulating layer and electrically connected to the first conductive pad through the first through-hole and the third through-hole;
a second insulating layer disposed on the second conductive pad and comprising a second through-hole, a first recessed portion and a second recessed portion, wherein the first recessed portion overlaps the first through-hole, and the second recessed portion overlaps the third through-hole; and
a third conductive pad disposed on the second insulating layer and electrically connected to the second conductive pad through the second through-hole,
wherein the third conductive pad extends on a surface of the first recessed portion and a surface the second recessed portion,
wherein the first conductive pad comprises two contact portions, the two contact portions do not overlap the second through-hole, the second conductive pad is in contact with one of the two contact portions through the first through-hole, and the second conductive pad is in contact with the other of the two contact portions through the third through-hole.

2. The connection structure as claimed in claim 1, wherein the first conductive pad has a long axis extending along a first direction, and the two contact portions are arranged along the first direction.

3. The connection structure as claimed in claim 1, wherein a depth of the first recess portion is different from a depth of the second through-hole.

4. The connection structure as claimed in claim 1, wherein the first conductive pad has a short axis extending along a second direction, and the third conductive pad extends beyond an edge of the second conductive pad in the second direction.

5. The connection structure as claimed in claim 1, wherein the first conductive pad has a short axis extending along a second direction, and the third conductive pad extends beyond an edge of the first conductive pad in the second direction.

6. The connection structure as claimed in claim 1, wherein the first conductive pad has a short axis extending along a second direction, the second insulating layer has a side recessed portion, the side recessed portion extends beyond an edge of the second conductive pad in the second direction, and the third conductive pad extends on a surface of the side recessed portion.

7. The connection structure as claimed in claim 6, wherein a depth of the side recessed portion is greater than a depth of the first recessed portion.

8. The connection structure as claimed in claim 6, wherein the surface of the side recessed portion has a stepped profile.

9. An electronic device, comprising:
a substrate;
an electronic unit disposed on the substrate;
a driving unit disposed on the substrate;
a connection structure disposed on the substrate and electrically connected to the electronic unit and the driving unit, and the connection structure comprises:
a first conductive pad;
a first insulating layer disposed on the first conductive pad and comprising a first through-hole and a third through-hole;
a second conductive pad disposed on the first insulating layer and electrically connected to the first conductive pad through the first through-hole and the third through-hole;
a second insulating layer disposed on the second conductive pad and comprising a second through-hole, a first recessed portion and a second recessed portion, wherein the first recessed portion overlaps the first through-hole, and the second recessed portion overlaps the third through-hole; and
a third conductive pad disposed on the second insulating layer and electrically connected to the second conductive pad through the second through-hole,
wherein the third conductive pad extends on a surface of the first recessed portion and a surface the second recessed portion,
wherein the first conductive pad comprises two contact portions, the two contact portions do not overlap the second through-hole, the second conductive pad is in contact with one of the two contact portions through the first through-hole, and the second conductive pad is in contact with the other of the two contact portions through the third through-hole.

10. The electronic device as claimed in claim 9, wherein the first conductive pad has a long axis extending along a first direction, and the two contact portions are arranged along the first direction.

11. The electronic device as claimed in 9, wherein a depth of the first recess portion is different from a depth of the second through-hole.

12. The electronic device as claimed in claim 9, wherein the first conductive pad has a short axis extending along a second direction, and the third conductive pad extends beyond an edge of the second conductive pad in the second direction.

13. The electronic device as claimed in claim 9, wherein the first conductive pad has a short axis extending along a second direction, and the third conductive pad extends beyond an edge of the first conductive pad in the second direction.

14. The electronic device as claimed in claim 9, wherein the first conductive pad has a short axis extending along a second direction, the second insulating layer has a side recessed portion, the side recessed portion extends beyond an edge of the second conductive pad in the second direction, and the third conductive pad extends on a surface of the side recessed portion.

15. The electronic device as claimed in claim 14, wherein a depth of the side recessed portion is greater than a depth of the first recessed portion.

16. The electronic device as claimed in claim 14, wherein the surface of the side recessed portion has a stepped profile.

* * * * *